United States Patent
Huang et al.

(10) Patent No.: US 10,050,001 B2
(45) Date of Patent: *Aug. 14, 2018

(54) PACKAGING DEVICE AND METHOD OF MAKING THE SAME

(71) Applicant: Taiwan Semiconductor Manufacturing Co., Ltd., Hsin-Chu (TW)

(72) Inventors: Chang-Chia Huang, Hsinchu (TW); Tsung-Shu Lin, New Taipei (TW); Ming-Da Cheng, Jhubei (TW); Wen-Hsiung Lu, Jhonghe (TW); Bor-Rung Su, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

This patent is subject to a terminal disclaimer.

(21) Appl. No.: 15/268,693

(22) Filed: Sep. 19, 2016

(65) Prior Publication Data

US 2017/0005060 A1     Jan. 5, 2017

Related U.S. Application Data

(63) Continuation of application No. 13/434,256, filed on Mar. 29, 2012, now Pat. No. 9,449,933.

(51) Int. Cl.
*H01L 23/498* (2006.01)
*H01L 23/48* (2006.01)
(Continued)

(52) U.S. Cl.
CPC ............ *H01L 24/16* (2013.01); *H01L 21/565* (2013.01); *H01L 23/4824* (2013.01);
(Continued)

(58) Field of Classification Search
CPC ..... H01L 23/498; H01L 23/48; H01L 23/538; H01L 23/4824; H01L 21/28; H01L 21/302

See application file for complete search history.

(56) References Cited

U.S. PATENT DOCUMENTS 4,289,834 A   9/1981   Alcorn et al.
4,294,782 A   10/1981  Froehlig
(Continued)

FOREIGN PATENT DOCUMENTS

WO   2003041130 A2   5/2003

OTHER PUBLICATIONS

Non-Final Office Action dated Dec. 17, 2013 for U.S. Appl. No. 13/434,256.
(Continued)

*Primary Examiner* — David Zarneke
(74) *Attorney, Agent, or Firm* — Eschweiler & Potashnik, LLC

(57) ABSTRACT

The present disclosure relates to an integrated chip packaging device. In some embodiments, the packaging device has a first package component. A metal trace is arranged on a surface of the first package component. The metal trace has an undercut. A molding material fills the undercut of the metal trace and has a sloped outermost sidewall with a height that monotonically decreases from a position below a top surface of the metal trace to the surface of the first package component. A solder region is arranged over the metal trace.

20 Claims, 7 Drawing Sheets

(51) Int. Cl.

| | | |
|---|---|---|
| *H01L 23/538* | (2006.01) | |
| *H01L 21/28* | (2006.01) | |
| *H01L 21/302* | (2006.01) | |
| *H01L 23/00* | (2006.01) | |
| *H01L 23/482* | (2006.01) | |
| *H01L 21/56* | (2006.01) | |
| *H01L 21/768* | (2006.01) | |

(52) U.S. Cl.
CPC .......... *H01L 23/498* (2013.01); *H01L 24/03* (2013.01); *H01L 24/05* (2013.01); *H01L 24/11* (2013.01); *H01L 24/13* (2013.01); *H01L 21/28* (2013.01); *H01L 21/302* (2013.01); *H01L 21/76895* (2013.01); *H01L 23/48* (2013.01); *H01L 23/538* (2013.01); *H01L 24/04* (2013.01); *H01L 2224/0401* (2013.01); *H01L 2224/056* (2013.01); *H01L 2224/05556* (2013.01); *H01L 2224/05567* (2013.01); *H01L 2224/05572* (2013.01); *H01L 2224/131* (2013.01); *H01L 2224/13083* (2013.01); *H01L 2224/13144* (2013.01); *H01L 2224/13147* (2013.01); *H01L 2224/13155* (2013.01); *H01L 2224/13164* (2013.01); *H01L 2224/16238* (2013.01); *H01L 2224/81191* (2013.01); *H01L 2224/81815* (2013.01); *H01L 2924/00014* (2013.01); *H01L 2924/01322* (2013.01); *H01L 2924/15311* (2013.01)

(56) References Cited

U.S. PATENT DOCUMENTS

| | | | |
|---|---|---|---|
| 6,228,466 | B1 | 5/2001 | Tsukada et al. |
| 6,229,209 | B1 | 5/2001 | Nakamura et al. |
| 6,396,707 | B1 | 5/2002 | Huang et al. |
| 6,404,051 | B1 | 6/2002 | Ezawa et al. |
| 6,809,415 | B2 | 10/2004 | Tsukada et al. |
| 7,019,407 | B2 | 3/2006 | Chen et al. |
| 7,193,324 | B2 | 3/2007 | Hsu |
| 7,253,510 | B2 | 8/2007 | Harvey |
| 8,563,416 | B2 | 10/2013 | Erwin et al. |
| 8,884,432 | B2 | 11/2014 | Sakuma et al. |
| 9,123,704 | B2 | 9/2015 | Sasaki et al. |
| 9,318,460 | B2 | 4/2016 | Sakuma et al. |
| 2002/0053466 | A1 | 5/2002 | Kusui |
| 2003/0148593 | A1 | 8/2003 | Okamoto et al. |
| 2005/0056445 | A1 | 3/2005 | Orui et al. |
| 2007/0284420 | A1 | 12/2007 | Tan et al. |
| 2008/0217768 | A1 | 9/2008 | Miranda et al. |
| 2009/0051036 | A1 | 2/2009 | Abbott |
| 2010/0155941 | A1 | 6/2010 | Matsuki et al. |
| 2010/0283152 | A1 | 11/2010 | Chen et al. |
| 2013/0143361 | A1 | 6/2013 | Lin et al. |
| 2013/0256879 | A1 | 10/2013 | Migita et al. |
| 2015/0194396 | A1 | 7/2015 | Safai et al. |

OTHER PUBLICATIONS

Final Office Action dated Mar. 27, 2014 for U.S. Appl. No. 13/434,256.

Non-Final Office Action dated Nov. 12, 2014 for U.S. Appl. No. 13/434,256.

Final Office Action dated Jun. 25, 2015 for U.S. Appl. No. 13/434,256.

Non-Final Office Action dated Sep. 15, 2015 for U.S. Appl. No. 13/434,256.

Final Office Action dated Mar. 10, 2016 for U.S. Appl. No. 13/434,256.

Notice of Allowance dated May 20, 2016 for U.S. Appl. No. 13/434,256.

PACKAGING DEVICE AND METHOD OF MAKING THE SAME

REFERENCE TO RELATED APPLICATION

This Application is a Continuation of U.S. application Ser. No. 13/434,256 filed on Mar. 29, 2012, the contents of which is hereby incorporated by reference in its entirety.

BACKGROUND

Bump-on-Trace (BOT) structures were used in flip chip packages, wherein metal bumps are bonded onto metal traces in package substrates directly, rather than bonded onto metal pads that have greater widths than the respective connecting metal traces. The BOT structures, compared with bonding structures bound to metal pads, help to reduce chip areas, and lower the manufacturing cost of the integrated circuit (IC) having BOT structures. In some applications, the BOT structures may achieve the same reliability as the conventional bond structures that are based on metal pads.

During the BOT manufacturing process, the metal bumps are soldered onto respective metal traces on the substrate by a reflow process. A reflowing process is a process in which solder is attached to a first conductive member, melted by heat, and then solidified. In some applications, the melted solder is caused to be in contact with both the first conductive member and a second conductive member, and then the solder connects the first and second conductive members after being solidified. Heating may be accomplished by passing the structure through a reflow oven or under a heating device, or by soldering individual joints with a hot air pencil.

During the reflowing process, the resulting packaging component needs to be cooled down from the hot reflow condition to room temperature. The drop in temperature would cause the metal traces and the substrate to contract. Because the metal traces and the substrate have different coefficient of thermal expansions (CTEs), the mismatch in the respective CTEs creates stress at the interface between the metal traces and the substrate. The CTE mismatch and the stress caused by the mismatch would result in the trace being dislocated from the substrate, which is also referred to as a phenomenon called "peeling." This dislocation of the metal traces from the substrate, i.e., peeling, would cause the packaging device to fail prematurely.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Packages comprising Bump-on-Trace (BOT) structures are provided in accordance with embodiments. The variations of the embodiments are discussed. Throughout the various views and illustrative embodiments, like reference numbers are used to designate like elements.

Figure 1:
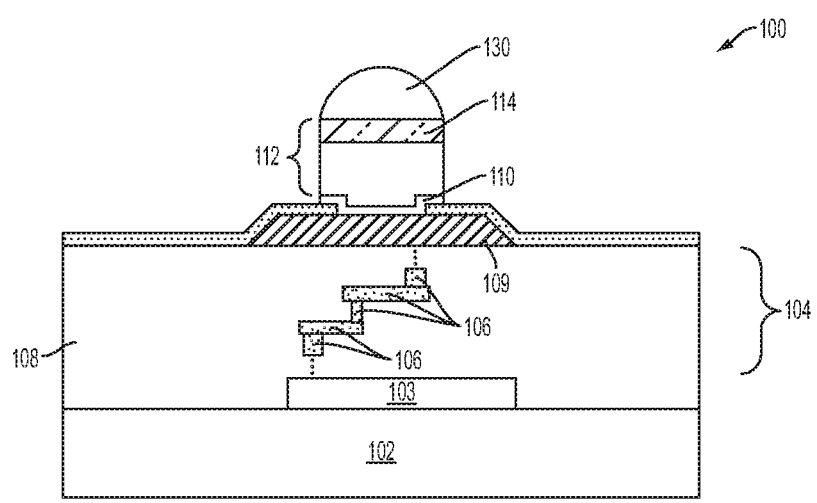
FIG. 1 is a cross-sectional view of a first package component in accordance with one or more embodiments.

FIG. 1 is a cross-sectional view of package component 100 in accordance with one or more embodiments. In some embodiments, package component 100 is a device die that includes active devices 103 (such as transistors) therein. In some alternative embodiments, package component 100 is a passive component that does not have active devices therein. In an embodiment wherein package component 100 is a device die, substrate 102 may be a semiconductor substrate such as a silicon substrate, although it may include other semiconductor materials. Interconnect structure 104, which includes metal lines and vias 106 formed therein and connected to active devices 103, is formed over substrate 102. In some embodiments, metal lines and vias 106 comprise a material including copper or copper alloys, and are formed using damascene processes. Interconnect structure 104 may include an Inter-Layer Dielectric (ILD) and Inter-Metal Dielectrics (IMDs) 108. IMDs 108 may comprise low dielectric constant (low-k) dielectric materials, and may have dielectric constants (k values) lower than about 3.0. The low-k dielectric materials may also be extreme low-k dielectric materials having k values lower than about 2.5, for example. Package component 100 may further include metal pad 109, Under-Bump Metallurgy (UBM) 110 on metal pad 109, and metal pillar 112 on UBM 110. Metal pillar 112 may comprise a copper pillar, and hence is referred to as copper pillar 112, copper-containing bump 112, or metal bump 112 hereinafter. Metal pillar 112 may further comprise a nickel layer, a palladium layer, a gold layer, or multilayers thereof, which layer(s) are collectively identified by reference numeral 114. In at least one embodiment, solder cap 130 may be formed on copper pillar 112, for example, by plating a solder layer on the top of copper pillar 112, and then reflowing the solder layer.

Figure 2A:
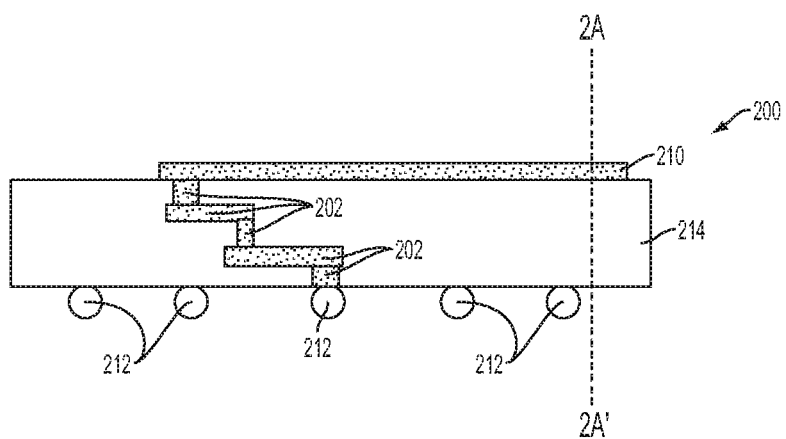
FIGS. 2A and 2B are cross-sectional views of a second package component in accordance with one or more embodiments.

FIG. 2A is a cross-sectional view of another package component 200. Package component 200 may be a package substrate, although it may be another type of package component such as an interposer, for example. Package component 200 may include metal lines and vias 202 interconnecting the metal features that are on opposite sides of package component 200. In at least one embodiment, metal trace 210 is located at a top surface of package component 200, and may be electrically connected to connectors 212 on the bottom side of package components 200 through metal lines and vias 202. Connectors 212 may be solder balls, metal pillars with solder caps thereon, metal pads, or the like. Metal lines and vias 202 may be formed in dielectric layers 214, which may be laminate films, for example. In some alternative embodiments, metal lines and vias 202 may be formed in a semiconductor substrate (such as a silicon substrate, not shown) or a dielectric core (not shown), and also in the dielectric layers that are formed on the semiconductor substrate or the dielectric core. In some embodiments, metal trace 210 comprises a material including copper, aluminum copper, tungsten, nickel, palladium, gold, and/or combinations thereof.

Figure 2B:
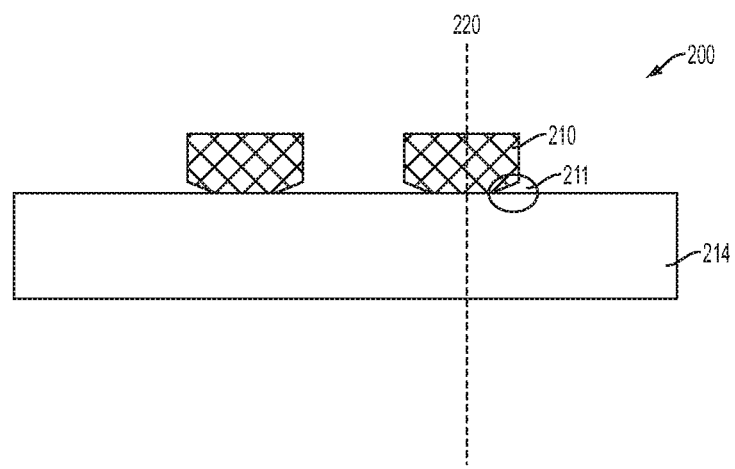

FIG. 2B is a cross-sectional view of the package structure 200 shown in FIG. 2A, wherein the cross-sectional view is obtained from the plane crossing line 2A-2A' in FIG. 2A. As shown in FIG. 2B, when metal traces 210 were formed on the substrate 214, undercuts 211 appear on the two edges along the length of the metal traces 210 at the interface between the metal traces 210 and the substrate 214. During the heating and the subsequent cooling in conjunction with performing a reflow process, the stress caused by thermal contraction and expansion and CTE mismatch as discussed above would cause the undercuts 211 to develop into cracks. These cracks would propagate toward the centerlines 220 of the metal traces 210 and thereby eventually "peel" the metal traces 210 away from the substrate.

Figure 3:
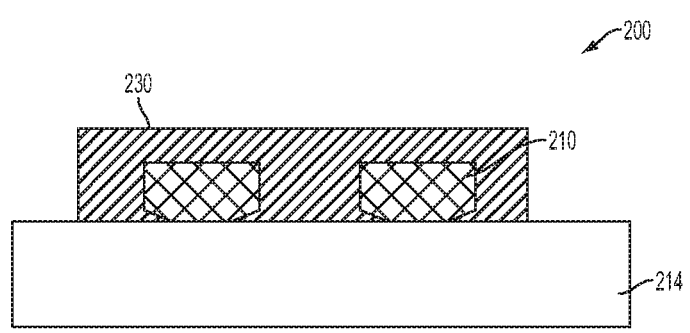
FIGS. 3 and 4 are cross sectional views of the second package component at different processing stages in accordance with one embodiment of the present disclosure.

FIG. 3 is a cross sectional view of the second package component 200 after a liquid molding process in accordance to this disclosure. In some embodiments, before the packaging components 100 and 200 are being assembled into one integrated piece of packaging device, a liquid molding process is applied to the packaging component 200. The liquid molding process comprises injecting a liquid molding material 230, such as a curable liquid, over the package component 200, so that the curable liquid 230 fills the undercuts 211 on the sides of the metal traces 210. In this embodiment, as FIG. 3 shows, the curable liquid 230 covers the entirety of metal traces 210. The liquid molding process can be carried out by any applicable means using applicable liquid molding apparatus. In some embodiments, the curable liquid 230 is formed by using the process and apparatus described in U.S. Pat. No. 4,294,782.

Figure 4:
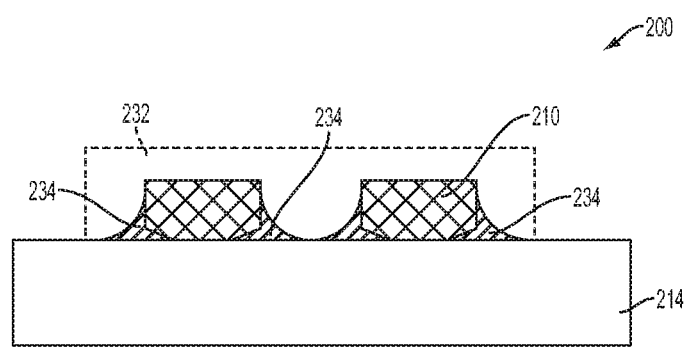

FIG. 4 is a cross sectional view of the second package component 200 after a plasma treatment in accordance to this disclosure. Thereafter, the overmolded surface of the metal traces 210 is treated by plasma. In some embodiments, the plasma treatment is performed according to a process similar to the one described in WO 2003/41130. Plasma treatment discussed here can comprise exposing the package component 200 to a gaseous state activated by a form of energy externally applied and includes, but not limited to, corona discharge, dielectric barrier discharge, flame, low pressure glow discharge, and atmospheric glow discharge treatment. The gas used in this plasma treatment can be air, ammonia, argon, carbon dioxide, carbon monoxide, helium, hydrogen, crypton, neon, nitrogen, nitrous oxide, oxygen, ozone, water vapor, combinations thereof, and others. In some alternative embodiments, other more reactive gases or vapors can be used, either in their normal state of gases at the process application pressure or vaporized with a suitable device from otherwise liquid states, such as hexamethyldisiloxane, cyclopolydiethylsiloxane, cyclopolyhydrogenmethylsiloxanes, cyclopolyhydrogenmethyl-co-dimethylsiloxanes, reactive silanes, and combinations thereof. As FIG. 4 shows, while the plasma removes the liquid molding material (as represented by the dotted region 232) above the top surfaces of the metal traces 210, a portion of the liquid molding material 234 that fills the undercuts 211 remains.

In this embodiment, the package component 200 may be overmolded using a curable liquid organic composition, a curable liquid silicone-organic copolymer composition, or a curable liquid silicone composition. The type of curable liquid composition selected depends on various factors including the type of die attach adhesive used.

Examples of suitable curable liquid organic compositions include curable liquid epoxies, curable liquid cyanate esters, and combinations thereof. Examples of suitable curable liquid silicone-organic copolymer compositions include curable liquid compositions that cure to form poly(diorganosiloxane/organic) block copolymers such as poly(diorganosiloxane/amide) copolymers.

Suitable curable liquid silicone compositions include condensation reaction curable liquid silicone compositions; addition reaction curable liquid silicone composition; ultraviolet radiation initiated curable liquid silicone compositions; and/or free radical initiated curable liquid silicone compositions.

Addition reaction curable silicone compositions may be used to minimize by-products formed when curing, as compared to the other types of curable liquid silicone compositions. The addition reaction curable liquid silicone compositions may comprise (a) an organopolysiloxane having an average of at least two alkenyl groups per molecule, (b) an organohydrogenpolysiloxane having an average of at least two silicon atom-bonded hydrogen atoms per molecule, and (c) a hydrosilylation catalyst. The addition reaction curable liquid silicone composition may further comprise one or more optional ingredients selected from (d) a filler, (e) a treating agent for the filler, (f) a catalyst inhibitor, (g) a solvent, (he) an adhesion promoter, (i) a photosensitizer, (j) a pigment, (k) a flexibilizer, and combinations thereof.

Suitable fillers for component (d) include reinforcing fillers such as silica (e.g., fumed silica, fused silica, and ground silica), titania, and combinations thereof. In some alternative embodiments, component (d) may be thermally conductive, electrically conductive, or both. In some alternative embodiments, component (d) may comprise a combination of conductive and nonconductive fillers. Component (d) may comprise DRAM grade filler or a mixture of DRAM grade filler and filler of a lesser purity than DRAM grade filler. Component (k) may comprise a long chain alpha-olefin, e.g., an olefin with 14 or more carbon atoms.

The curable liquid may be a one-part composition or a multiple-part composition such as a two-part composition. When an addition reaction curable liquid silicone composition is formulated as a one-part composition, a hydrosilylation catalyst inhibition may be included. When an addition reaction curable liquid silicone composition is formulated as a multiple part composition, any silicone containing ingredients are stored separately from any hydrosilylation catalyst.

The curable liquid is formulated to have a viscosity that will minimize wire sweep under the liquid injection molding conditions. Without wishing to be bound by any theory, it is thought that viscosity that is too high will contribute to wire sweep, however, viscosity that is too low may allow the curable liquid to leak from the mold. For some addition reaction curable liquid silicone compositions viscosity may be 80 to 3,000 Poise.

The curable liquid may be cured at a predetermined temperature for a predetermined period of time to have a cure speed that will minimize wire sweep under the liquid injection molding conditions. A cure speed that is too fast may contribute to wire sweep, however, cure speed that is too slow may render the process inefficient. For some addition reaction curable liquid silicone compositions, the curing of the curable liquid is performed at 80 to 240.degree. C. for 30 to 120 seconds, or alternatively at 80 to 180.degree. C. for 30 to 60 seconds, or alternatively at 80 to 150.degree. C. for 30 to 60 seconds.

Figure 5A:
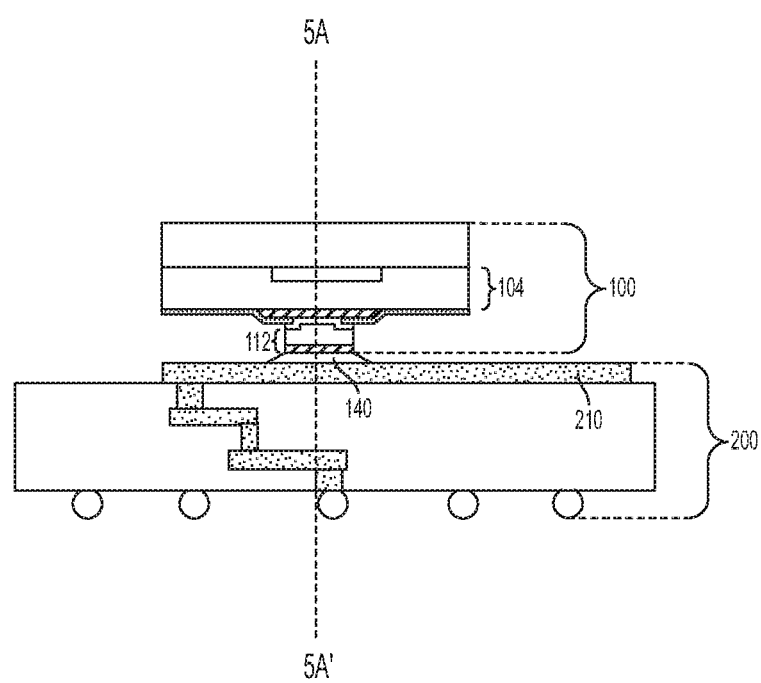
FIGS. 5A and 5B are cross-sectional views of a package comprising the first and the second package components.

Referring to FIG. 5A, package components 100 and 200 are bonded with each other through solder region 140 (alternatively referred to as a solder bump). Solder cap 130 in package component 100 (FIG. 3) may be reflowed to form an entirety or a portion of solder bump 140. Solder bump 140 may be formed of a lead-free solder, a eutectic solder, or the like. Solder bump 140 is bonded to, and contacts, the top surface of metal trace 210, wherein the top surface faces package component 100. After the bonding of package components 100 and 200, an underfill (not shown) may be filled into the space between package components 100 and 200. Accordingly, the underfill is also filled into the space between neighboring metal traces 210, and may contact metal trace 210. In some alternative embodiments, no underfill is dispensed, while the air fills the space between package components 100 and 200, and fills the space between neighboring metal traces 210.

Figure 5B:
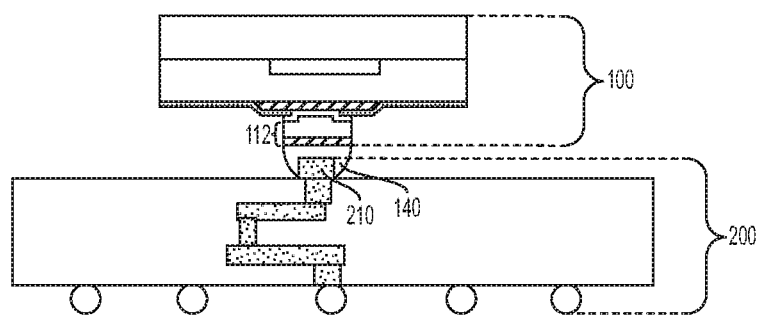

FIG. 5B is a cross-sectional view of the package structure shown in FIG. 5A, wherein the cross-sectional view is obtained from the plane crossing line 5B-5B' in FIG. 5A. As shown in FIG. 5B, solder bump 140 may contact the opposite edges of metal trace 210. In some applications, the bond structure comprising copper pillar 112, solder bump 140, and metal trace 210 collectively are also referred to as a BOT structure. Note that in this embodiment, the undercuts 211 on both sides of the metal traces 210 have been filled with liquid molding material (as depicted in FIG. 4).

In some embodiments, by filling the undercuts 211 of the metal traces 210 at the interface between the metal traces 210 and the substrate 214, the undercuts 211 are protected from stresses caused by CTE mismatching, and the creation of cracks initiating at the undercuts 211 is prevented. Accordingly, the chances for "peeling," which is caused by propagation of cracks originating from the undercuts 211 at the edges of the metal traces 210, may be reduced.

Therefore, the present disclosure relates to a bump on trace (BoT) technique that attaches a die by solder to a metal trace. The BoT technique reduces trace peeling by filling undercuts with a molding material that protects the undercuts from stresses caused by CTE (coefficient of thermal expansion) mismatches.

In some embodiments, the present disclosure relates to an integrated chip packaging device. The device comprises a first package component, and a metal trace arranged on a surface of the first package component. The metal trace comprises an undercut. A molding material fills the undercut of the metal trace and has a sloped outermost sidewall with a height that monotonically decreases from a position below a top surface of the metal trace to the surface of the first package component. A solder region is arranged over the metal trace.

In other embodiments, the present disclosure relates to an integrated chip packaging device. The device comprises a metal trace arranged over a first package component. The metal trace comprises an undercut. A molding material is arranged within the undercut of the metal trace. The molding material has an outermost sidewall with a slope that monotonically decreases as a distance from the first package component decreases. A solder region is arranged over the metal trace.

In yet other embodiments, the present disclosure relates to a method of forming an integrated chip packaging device. The method comprises forming a metal trace on a surface of a first package component, wherein the metal trace comprises an undercut. The method further comprises forming a molding material over an entirety of the metal trace, and removing a part of the molding material from a top surface of the metal trace and from a part of sidewalls of the metal trace. The method further comprises forming a solder region on the top surface of the metal trace.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated chip packaging device, comprising:
   a first package component;
   a metal trace arranged on a surface of the first package component, wherein the metal trace comprises an undercut;
   a molding material that fills the undercut of the metal trace and that has a sloped outermost sidewall with a height that monotonically decreases from a position below a top surface of the metal trace to the surface of the first package component; and
   a solder region arranged over the metal trace.

2. The device of claim 1, wherein a top surface of the molding material is arranged between the top surface of the metal trace and the surface of the first package component.

3. The device of claim 1, further comprising:
   a second metal trace arranged on the surface of the first package component and comprising a second undercut, wherein the molding material fills the second undercut but does not continuously extend over the surface between the metal trace and the second metal trace.

4. The device of claim 1, wherein the solder region surrounds the top surface of the metal trace and sidewalls of the metal trace above the molding material.

5. The device of claim 4, wherein the solder region contacts the sidewalls of the metal trace above the molding material.

6. The device of claim 4, further comprising:
   a metal pillar arranged between the solder region and a metal pad on a surface of a second package component, wherein the second package component is disposed over the first package component and the solder region contacts the metal pillar; and
   an under-bump metallurgy having a non-planar topology, which is arranged between the metal pillar and the metal pad.

7. The device of claim 1, wherein the molding material comprises a curable organic composition comprising curable epoxies, curable cyanate esters, or combinations thereof.

8. The device of claim 1, wherein the first package component comprises a bottom surface facing an opposite direction as the surface, and wherein the metal trace is electrically connected to one or more connectors on the bottom surface of the first package component through metal lines and vias arranged within the first package component.

9. The device of claim 1,
   wherein the metal trace has a length extending in a first direction and a width extending in a second direction substantially perpendicular to the first direction;

wherein the width is smaller than the length; and wherein the undercut is located along the length of the metal trace at an interface between the metal trace and the first package component.

10. An integrated chip packaging device, comprising:
a metal trace arranged over a first package component, wherein the metal trace comprises an undercut;
a molding material arranged within the undercut of the metal trace, wherein the molding material has an outermost sidewall with a slope that monotonically decreases as a distance from the first package component decreases; and
a solder region arranged over the metal trace.

11. The device of claim 10, further comprising:
a second package component disposed over the first package component, wherein the solder region is arranged over the metal trace between the first package component and the second package component.

12. The device of claim 10, wherein the molding material is arranged within the undercut at a location that is between the first package component and the metal trace.

13. The device of claim 10, wherein a top surface of the molding material is below a top surface of the metal trace.

14. The device of claim 10, further comprising:
a second metal trace arranged over the first package component and comprising a second undercut, wherein the molding material is arranged within the second undercut and does not continuously extend over the first package component between the metal trace and the second metal trace.

15. The device of claim 10, wherein the solder region surrounds a top surface and sidewalls of the metal trace above the molding material.

16. The device of claim 15, wherein the solder region contacts the sidewalls of the metal trace above the molding material.

17. An integrated chip packaging device, comprising:
a metal trace arranged over a first package component, wherein the metal trace has a sidewall defining an undercut;
a molding material arranged within the undercut, wherein the molding material has a first height at a first lateral distance from the metal trace and a second height at a second lateral distance from the metal trace that is larger than the first lateral distance; and
wherein the first height is along a first horizontal plane over the undercut and the second height is along a second horizontal plane intersecting the undercut.

18. The device of claim 17, wherein the undercut is defined by the sidewall of the metal trace and an upper surface of a dielectric material over a semiconductor substrate.

19. The device of claim 17, wherein a topmost point of the molding material abuts the metal trace.

20. The device of claim 17, wherein a topmost surface of the molding material is below a topmost surface of the metal trace.

* * * * *